(12) United States Patent
Miller, Jr. et al.

(10) Patent No.: US 7,642,181 B2
(45) Date of Patent: Jan. 5, 2010

(54) LOCOS SELF-ALIGNED TWIN WELL WITH A CO-PLANAR SILICON SURFACE

(75) Inventors: Gayle W. Miller, Jr., Colorado Springs, CO (US); Irwin D. Rathbun, Colorado Springs, CO (US); Bryan D. Sendelweck, Colorado Springs, CO (US); Thomas S. Moss, III, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 439 days.

(21) Appl. No.: 11/343,179

(22) Filed: Jan. 30, 2006

(65) Prior Publication Data

US 2007/0178677 A1    Aug. 2, 2007

(51) Int. Cl.
*H01L 21/425*    (2006.01)

(52) U.S. Cl. .................................... 438/527; 438/514

(58) Field of Classification Search ............... 438/514, 438/527
See application file for complete search history.

(56) References Cited

U.S. PATENT DOCUMENTS

| | | | |
|---|---|---|---|
| 4,599,789 A | 7/1986 | Gasner | 438/224 |
| 4,889,825 A | 12/1989 | Parrillo | 438/443 |
| 4,929,565 A | 5/1990 | Parrillo | 438/443 |
| 5,637,524 A * | 6/1997 | Lee et al. | 438/448 |
| 6,133,081 A | 10/2000 | Kim | 438/227 |
| 6,211,002 B1 | 4/2001 | Wu | 438/223 |
| 6,214,700 B1 * | 4/2001 | Ohashi et al. | 438/450 |
| 6,348,371 B1 | 2/2002 | Huang et al. | 438/218 |

* cited by examiner

*Primary Examiner*—Bradley K Smith
(74) *Attorney, Agent, or Firm*—Schwegman, Lundberg & Woessner P.A.

(57) ABSTRACT

A method and system for providing a twin well in a semiconductor device is described. The method and system include masking a first portion of the device such that a second portion of the device is exposed. A sacrificial layer has a first portion on the first portion of the device and a second portion on the second portion of the device. In one aspect, an oxidation stop layer may be below the sacrificial layer. The method and system include implanting a first well in the second portion of the device, exposing the first portion of the device after the first well is implanted, and oxidizing the second portion of sacrificial layer after the exposing. The method and system further include implanting the second well in the first portion of the device after the oxidizing and planarizing the device after the second well is implanted.

10 Claims, 19 Drawing Sheets

LOCOS SELF-ALIGNED TWIN WELL WITH A CO-PLANAR SILICON SURFACE

FIELD OF THE INVENTION

The present invention relates to semiconductor devices, and more particularly to a method and system for providing a twin well having a co-planar surface in a semiconductor device.

BACKGROUND OF THE INVENTION

Certain semiconductor devices include twin wells. A twin well includes a P well and an adjacent N well. FIG. 1 depicts a conventional method 10 for providing a conventional twin well semiconductor device. The portion of the conventional twin well semiconductor device in which the P well is to be formed is masked, via step 12. Step 12 includes forming a pad oxide over the surface of the wafer for the conventional twin well semiconductor device. Step 12 also includes depositing a nitride layer on the pad oxide over the surface of the wafer and providing a photoresist mask covering regions which are not to be implanted during formation of an N-well. Step 12 further includes removing the exposed portion of the nitride layer in regions in which the N-well is to be implanted. Consequently, the pad oxide is exposed in the regions in which the N-well is to be implanted, while the remaining nitride covers regions in which the P-well is to be formed. The photoresist mask may also be removed in step 12. The N-well is provided, via step 14. Step 14 thus includes implanting with phosphorus, arsenic or another N-type dopant. The silicon nitride layer is sufficiently thick to prevent the N-type dopant from passing through the nitride in regions in which the P-well is to be formed. In addition, a photoresist mask, which is virtually congruent to the remaining nitride underneath, may optionally be retained as present in step 12 and used as mask in conjunction with the remaining nitride. Consequently, step 14 allows the N-well to be provided.

After implantation of the N well, a LOCOS oxide is grown typically using a high temperature oxidizing ambient, via step 16. Prior to growing the LOCOS oxide, remaining photoresist is removed. The remaining nitride precludes the LOCOS oxide from being grown underneath, in the regions in which the P-well is to be formed. The remaining nitride is then removed typically using a hot phosphoric etch bath, via step 18. A P well is implanted typically using boron or another P-type dopant, via step 20. Because of the presence of the LOCOS oxide, the P-type dopant does not penetrate the N-well. The LOCOS oxide is then removed and the P implant activated, via step 22.

FIG. 2 depicts a conventional twin well semiconductor device 50. For clarity, the conventional semiconductor device 50 is not drawn to scale. The semiconductor device 50 is fabricated using the conventional method 10. The conventional semiconductor device 50 includes an N-well 52 and a P-well 56. Because the conventional method 10 is used, the N-well 52 and the P-well 56 are adjacent.

Although the method 10 can provide the conventional semiconductor device 50, one of ordinary skill in the art will readily recognize that the conventional semiconductor device 50 has serious drawbacks. In particular, the surfaces of the N-well 52 and P-well 56 are not coplanar. A step 60 exists between the surfaces of the N-well 52 and P-well 56. The step 60 adversely affects subsequent processing. For example, the step 60 may elevate electric fields and are associated with failures and defects, such as dielectric failure of a gate oxide that passes over a step. The step 60 may also cause out-of-focus conditions, which degrades imaging and reduces control over the properties of the conventional semiconductor device 50. The step 60 may also reduce the current carrying capacity of conductors which pass over the step 60 and reduce the mobility of charge carriers (electrons and/or holes) passing in the vicinity of the step 60. In addition, the step 60 may reduce the process window for chemical mechanical polishing (CMP). Moreover, the presence of the step 60 can result in the formation of stringers or unwanted pockets of material adjacent to them. Thus, utility of the conventional semiconductor device 50 may be limited.

Accordingly, what is needed is a method and system for providing an improved twin well device. The present invention addresses such a need.

BRIEF SUMMARY OF THE INVENTION

The present invention provides a method and system for providing a twin well in a semiconductor device. The method and system comprise masking a first portion of the semiconductor device such that a second portion of the semiconductor device is exposed. The semiconductor device includes a sacrificial layer having a first portion on the first portion of the semiconductor device and a second portion residing on the second portion of the semiconductor device. In one aspect, an oxidation stop layer may also be provided below the sacrificial layer. The method and system comprise implanting a first well in the second portion of the semiconductor device. The method and system also comprise exposing the first portion of the semiconductor device after the first well is implanted and oxidizing the second portion of sacrificial layer on the second portion of the semiconductor device after the exposing. In one aspect, the sacrificial layer may be completely oxidized. The method and system further comprise implanting the second well in the first portion of the semiconductor device after the oxidizing and planarizing the semiconductor device after the second well is implanted. The first well may be the P well while the second well may be the N well.

According to the method and system disclosed herein, the present invention provides a twin-well device having self-aligned N and P wells that have co-planar surfaces.

DETAILED DESCRIPTION OF THE INVENTION

The present invention relates to semiconductor devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a twin well in a semiconductor device. The method and system comprise masking a first portion of the semiconductor device such that a second portion of the semiconductor device is exposed. The semiconductor device includes a sacrificial layer having a first portion on the first portion of the semiconductor device and a second portion residing on the second portion of the semiconductor device. In one aspect, an oxidation stop layer may also be provided below the sacrificial layer. The method and system comprise implanting a first well in the second portion of the semiconductor device. The method and system also comprise exposing the first portion of the semiconductor device after the first well is implanted and oxidizing the second portion of sacrificial layer on the second portion of the semiconductor device after the exposing. In one aspect, the sacrificial layer may be completely oxidized. The method and system further comprise implanting the second well in the first portion of the semiconductor device after the oxidizing and planarizing the semiconductor device after the second well is implanted. The first well may be the P well while the second well may be the N well.

The present invention will be described in terms of a particular method having certain steps. However, one of ordinary skill in the art will readily recognize that the method in accordance with the present invention can include other and/or different steps not inconsistent with the present invention. Moreover, the present invention is described in the context of forming a particular number of well(s) in a device. One of ordinary skill in the art will, however, readily recognize that the present invention can be used in forming another number of wells.

Figure 1:
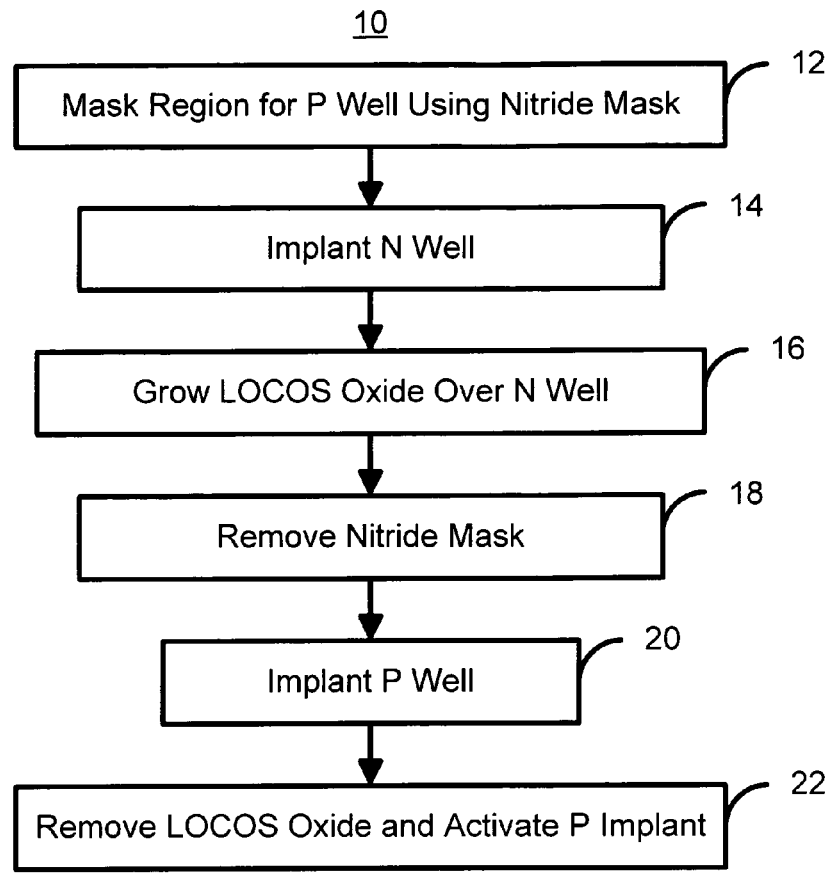
FIG. 1 is a diagram of a conventional method for forming a twin well device.
Figure 2:
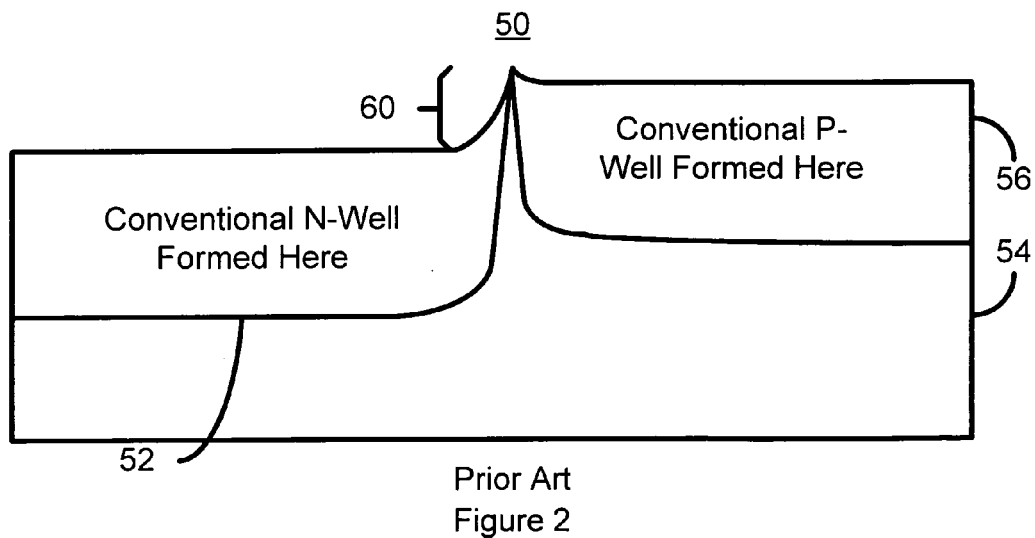
FIG. 2 is a diagram depicting a conventional twin well device.
Figure 3:
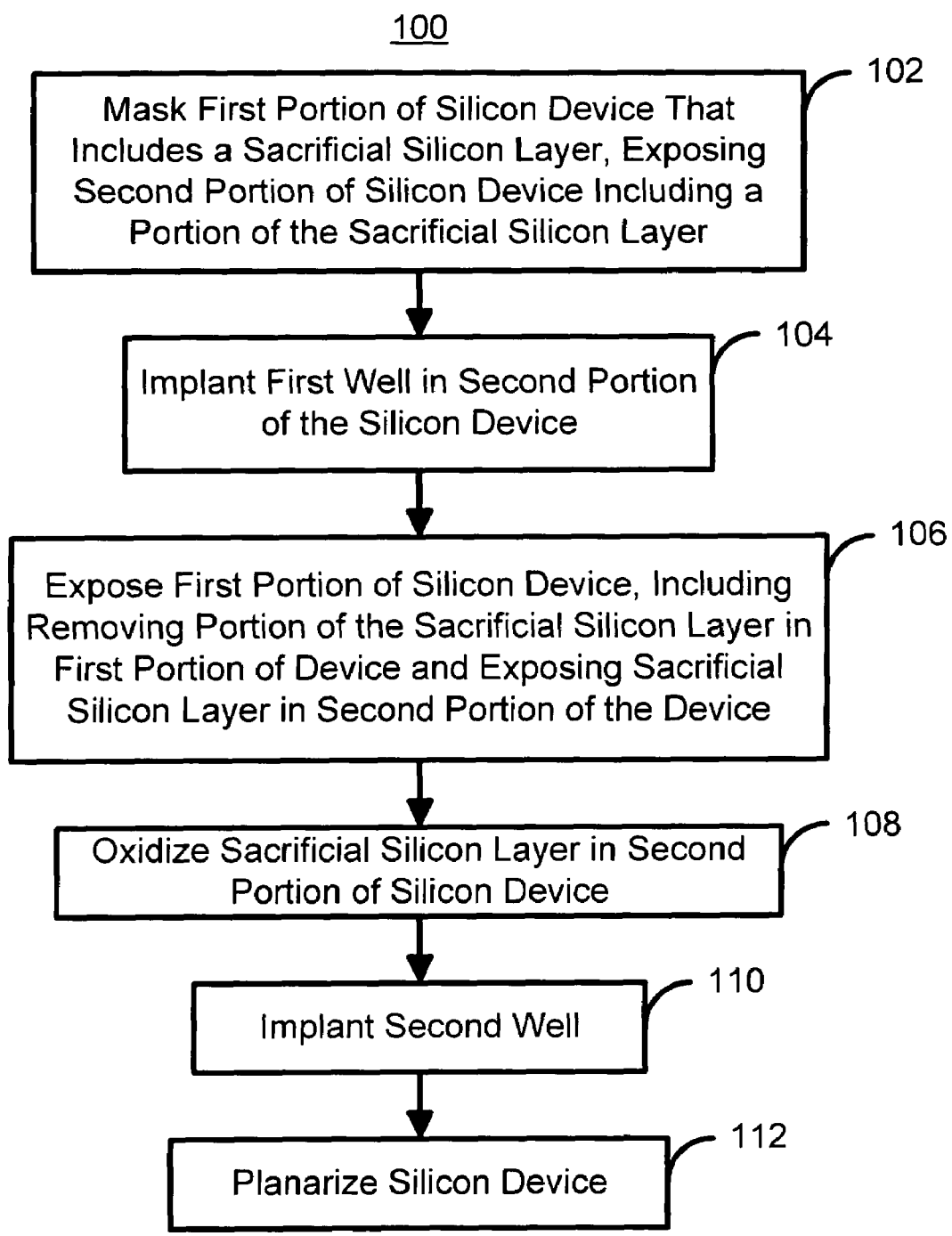
FIG. 3 is a flow chart of a one embodiment of a method in accordance with the present invention for forming a twin well device having coplanar surfaces.

FIG. 3 is a flow chart of a one embodiment of a method 100 in accordance with the present invention for forming a twin well device having coplanar surfaces. The method 100 is described in the context of forming a single twin well having an N-well and a P-well. However, one of ordinary skill in the art will readily recognize that the method 100 is generally extended to forming multiple twin wells on a silicon wafer. Furthermore, only certain steps are described in the method 100. Additional steps may also be included.

A first portion of the semiconductor device is masked while a second portion of the semiconductor device is exposed, via step 102. In a preferred embodiment, the N-well is to be formed in the first portion of the device, while the P-well is formed in the second portion of the device. Step 102 includes providing a sacrificial layer preferably composed of polysilicon over the surface of the semiconductor device. Thus, a first portion of the sacrificial layer residing in the first portion of the semiconductor device is masked. A second portion of the sacrificial layer residing in the second portion of the semiconductor device is exposed. Step 102 may include utilizing a photoresist mask on the first portion of the device. In a preferred embodiment, the mask includes the photoresist and at least a silicon nitride layer. Also in a preferred embodiment, the silicon nitride layer is formed by providing multiple layers including the silicon nitride layer on both the first and second portions of the device, then removing the silicon nitride from the second portion of the device. In one embodiment, the silicon nitride layer is provided directly on the sacrificial layer, which resides on a pad oxide layer. However, in another embodiment, described more fully below, an oxidation stop layer is provided between the sacrificial layer and the pad oxide and an additional pad oxide is preferably provided between the sacrificial layer and the silicon nitride layer. The mask prevents implantation of a dopant into the first portion of the semiconductor device.

Using a first dopant, a first well is implanted in the second portion of the semiconductor device, via step 104. In a preferred embodiment, step 104 includes implanting the P well. Because of the first portion of the device is masked, the first well resides in the second portion of the device. The first portion of the device is exposed after the first well is implanted, via step 106. Step 106 preferably includes removing the photoresist without removing the underlying silicon nitride layer. The second portion of the sacrificial layer, which resides on the second portion of the semiconductor device, is oxidized, via step 108. Step 108 is performed after the photoresist is removed in step 106. If an oxidation stop layer is used below the sacrificial layer, then step 108 may include oxidizing the sacrificial layer to completion without concern that such an oxide will affect underlying layers. The oxide formed using the second portion of the sacrificial layer in step 108 prevents a dopant being implanted from reaching substantially all the second portion of the semiconductor device.

Using a second dopant, a second well is implanted in the first portion of the semiconductor device, via step 110. Step 110 is preferably performed after removal of the silicon nitride layer that preferably resides under the photoresist mask and after the first, unoxidized, portion of the sacrificial layer has been removed. This removal is also preferably performed after the oxidizing step performed in step 108. Thus, second well is implanted in step 110 without the second dopant being implanted in the first well. Thus, N- and P-wells for the twin well semiconductor device are formed. The surface of the semiconductor device is planarized after the second well is implanted, via step 112. Thus, any differentials in the heights of the surfaces of the first and second wells are removed. Step 112 is preferably performed using a buffered oxide etch (BOE).

Using the method 100 a self-aligned twin well device is formed. Stated differently, the first and second wells are adjacent and self aligned. Consequently, there is no requirement for rigorous alignment of photoresist masks to provide the twin wells. Furthermore, the surfaces of the first and second wells are coplanar. Consequently, subsequent processing is greatly facilitated. This is achieved relatively simply, without requiring expensive additional masks and processing steps.

Figure 4:
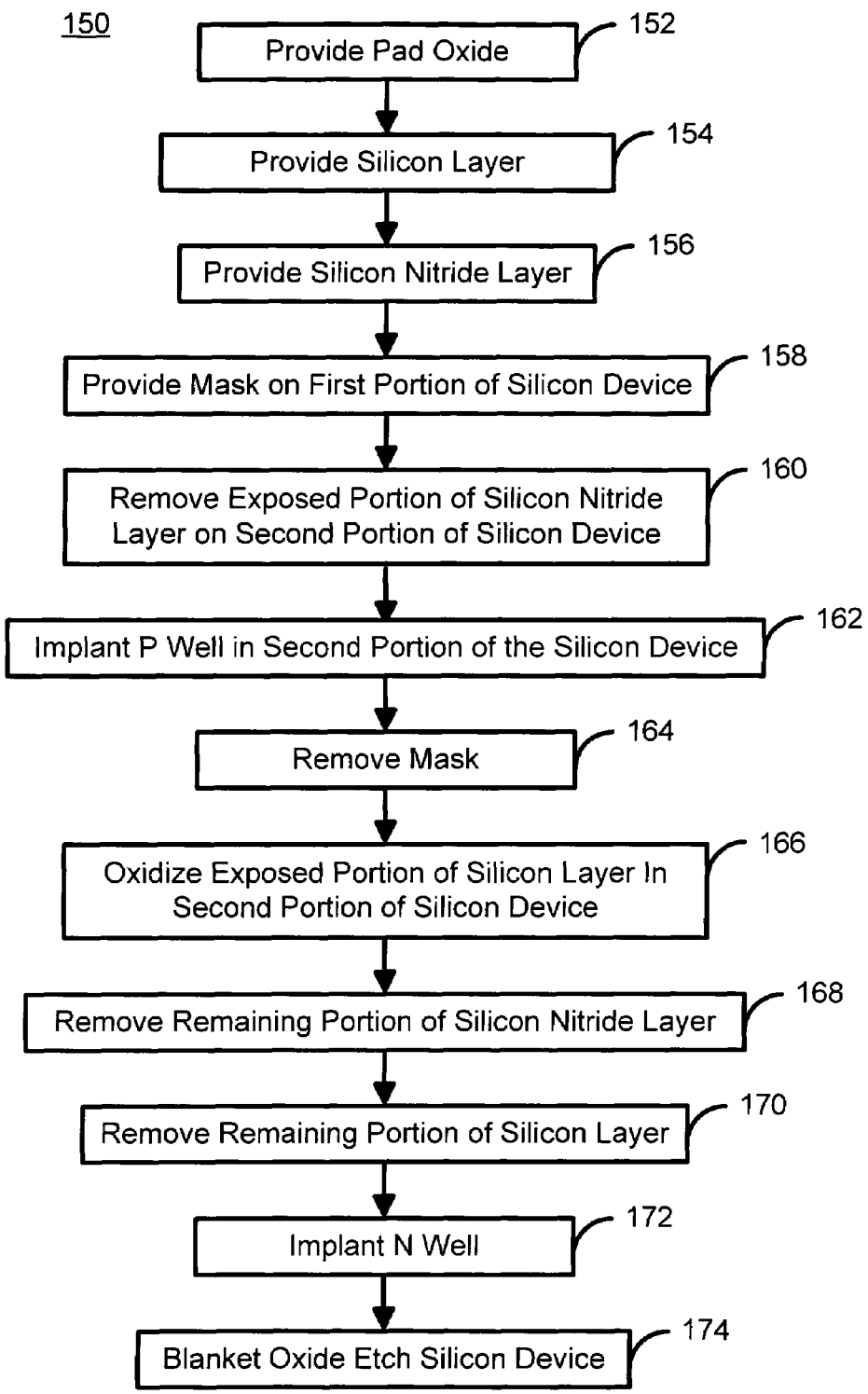
FIG. 4 is a flow chart of another embodiment of a method in accordance with the present invention for forming a twin well device having coplanar surfaces.

FIG. 4 is a flow chart of another, preferred, embodiment of a method 150 in accordance with the present invention for forming a twin well device having coplanar surfaces. FIGS. 5-13 depict one embodiment of twin well device 200 in accordance with the present invention during fabrication using the method 150. Thus, the method 150 is described in the context of the semiconductor device 200. For clarity, the semiconductor device 200 depicted in FIG. 5-13 is not drawn to scale.

Figure 5:
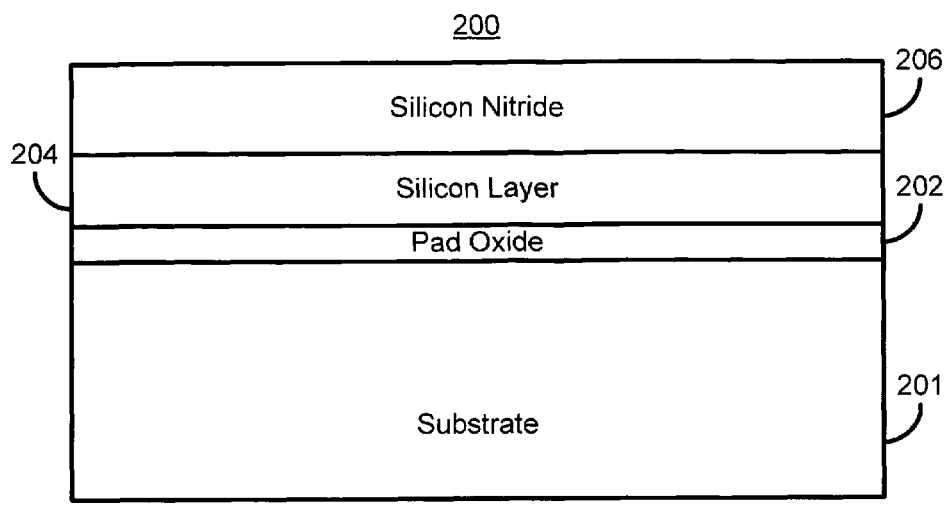
FIGS. 5-13 depict one embodiment of twin well device in accordance with the present invention during fabrication.

Referring to FIGS. 4 and 5-13, a pad oxide, a silicon layer that is preferably amorphous, and a silicon nitride layer are provided, via steps 152, 154, and 156, respectively. FIG. 5 depicts the semiconductor device 200 after step 156 has been completed. The semiconductor device 200 thus includes a pad oxide 202 formed on substrate 201, an amorphous silicon layer 204, and a silicon nitride layer 206. The pad oxide 202 is preferably at least approximately fifty Angstroms thick and not more than five hundred Angstroms thick. The amorphous silicon layer 204 is sufficiently thick that, when oxidized, the amorphous silicon layer 204 can prevent dopant from reaching underlying layers. Thus, in one embodiment, the amorphous silicon layer 204 is preferably approximately one thousand Angstroms thick. However, in other embodiments, the amorphous silicon layer 204 could be six hundred Angstroms thick and not more than two thousand Angstroms thick. The silicon nitride layer 206 is thick enough to prevent oxidation of an underlying layer. Thus, the silicon nitride layer 206 is preferably approximately one thousand two hundred Angstroms thick. In one embodiment, however, the silicon nitride layer 206 may be at least one hundred fifty Angstroms thick and not more than two thousand Angstroms thick.

Figure 6:
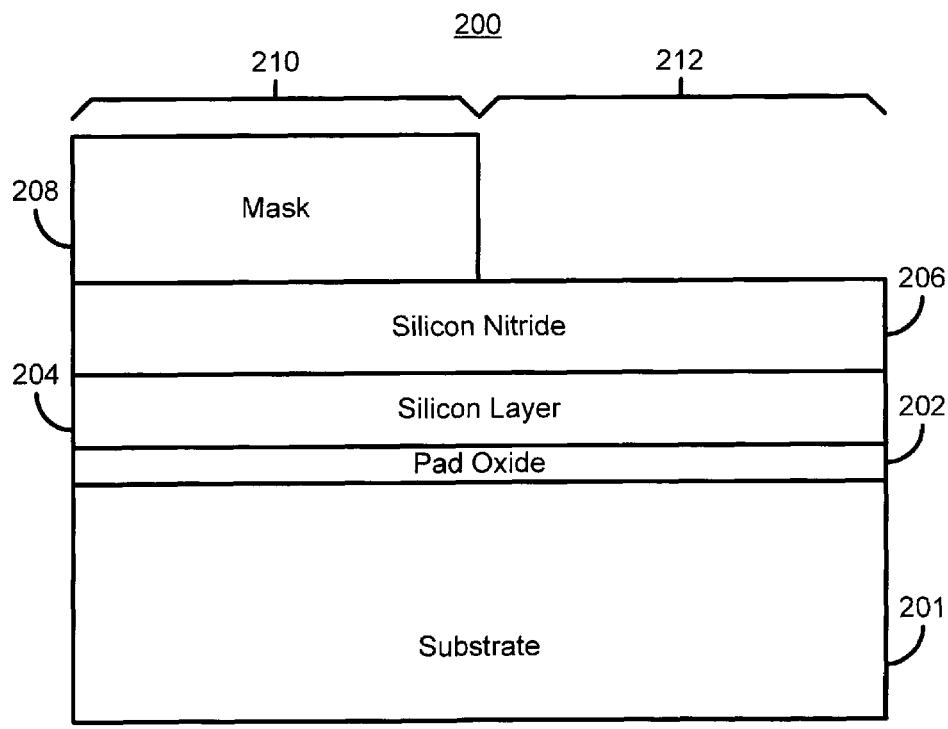
Figure 7:
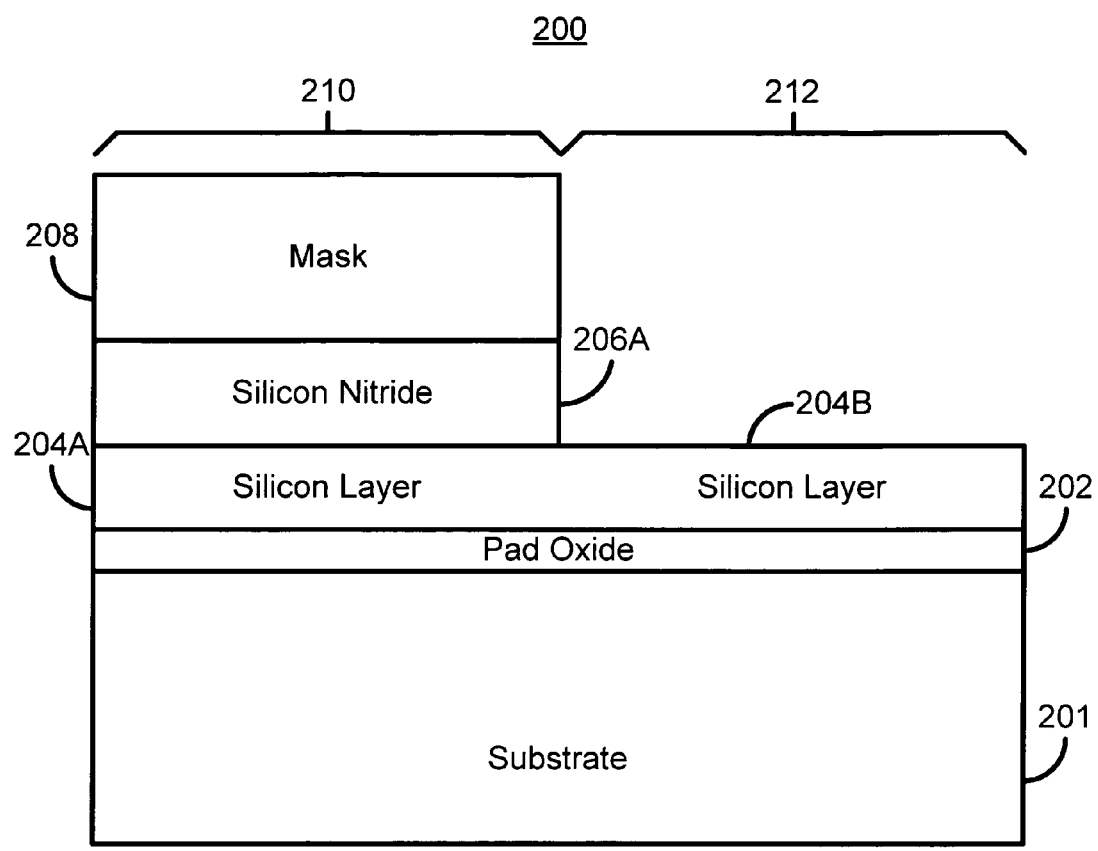
Figure 8:
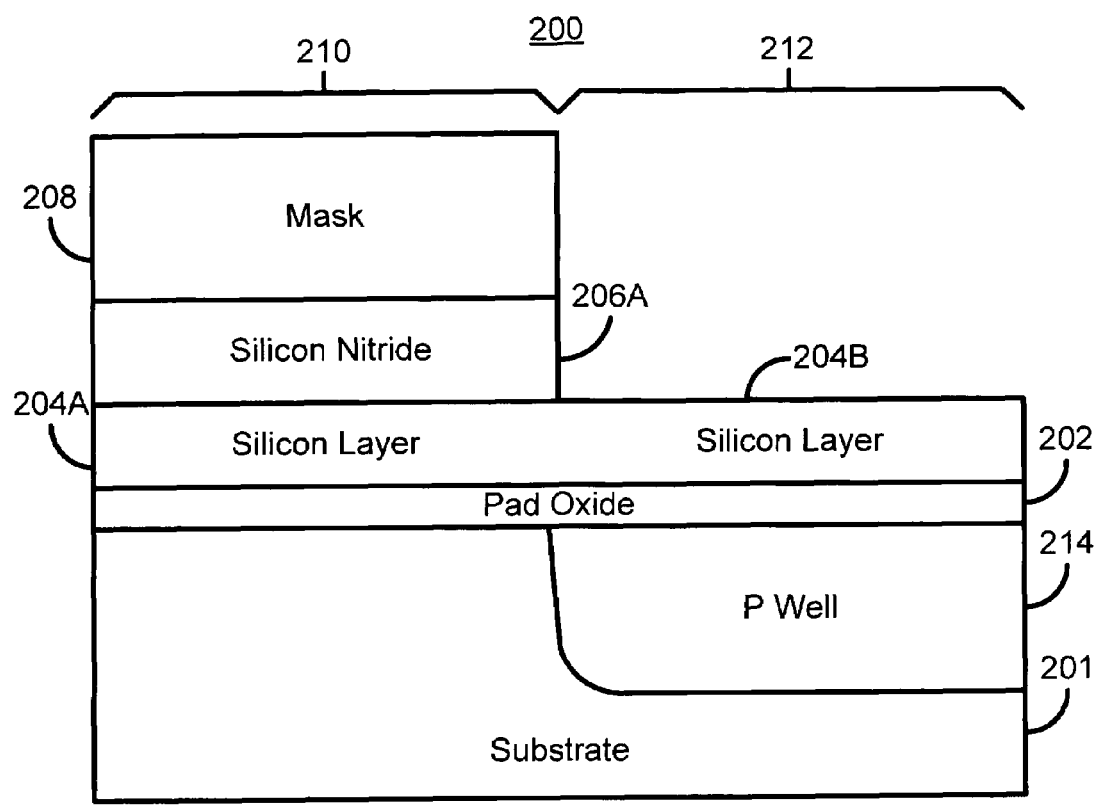

A photoresist mask is provided on a first portion of the semiconductor device 200, via step 158. Thus, the photoresist mask exposes a second portion of the semiconductor device 200. FIG. 6 depicts the semiconductor device 200 after the mask 208 has been provided. Thus, a first portion 210 of the semiconductor device 200 is covered while the second portion of the device 212 is exposed. A portion of the silicon nitride layer 206 that is in the second portion 202 of the semiconductor device 200 is removed, via step 160. FIG. 7 depicts the semiconductor device 200 after step 160 is completed. Thus, only silicon nitride 206A under the mask 208 remains. The portion of the silicon layer 204A in the first portion 210 of the semiconductor device 200 is masked, while the portion of the silicon layer 204B in the second portion 212 of the semiconductor device 200 is exposed. A P well is implanted using a P-type dopant, via step 162. FIG. 8 depicts the semiconductor device 200 after step 162 is completed. Because the first portion 210 of the semiconductor device 200 is masked, the implant only penetrates the substrate 201 in the second portion 212 of the device. Thus, the P well 214 resides in the second portion 212 of the semiconductor device 200.

Figure 9:
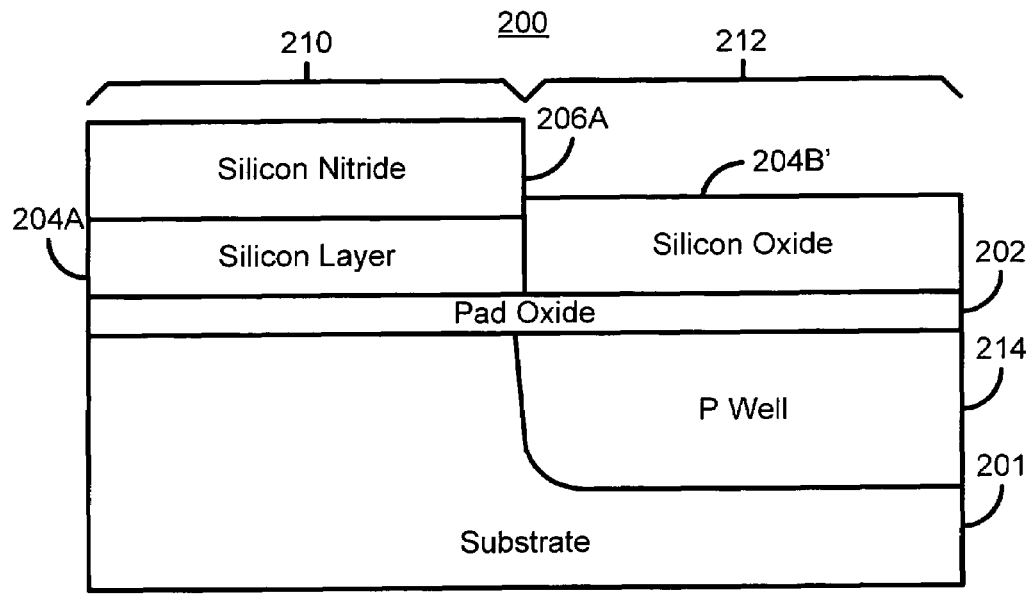

The photoresist mask 208 is removed, via step 164. Thus, the silicon nitride 206A is exposed. The exposed amorphous silicon layer 204B is oxidized, via step 166. FIG. 9 depicts the semiconductor device 200 after step 166 is completed. Thus, the mask 208 is no longer present. In addition, the silicon oxide 204B' has been formed in the second portion 212 of the device.

Figure 10:
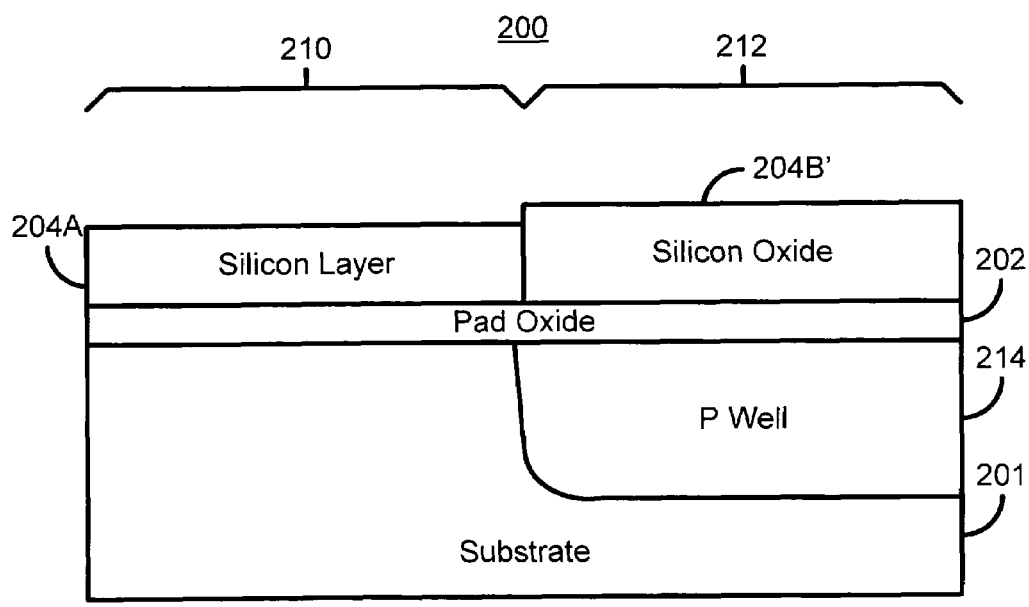
Figure 11:
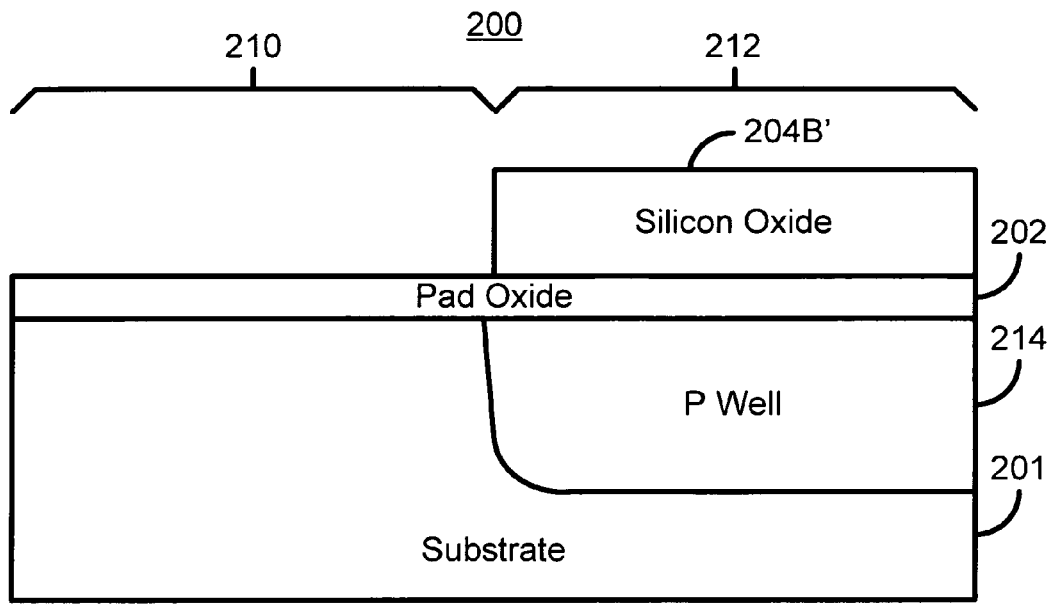

The remaining portion of the silicon nitride 206A is removed preferably using a hot phosphorus bath etch, via step 168. FIG. 10 depicts the semiconductor device 200 after the silicon nitride 206A has been removed. The remaining portion of the silicon layer 204A is removed, via step 170. Step 170 is preferably performed using a dry etch. FIG. 11 depicts the semiconductor device 200 after the portion of the silicon layer 204A has been removed.

Figure 12:
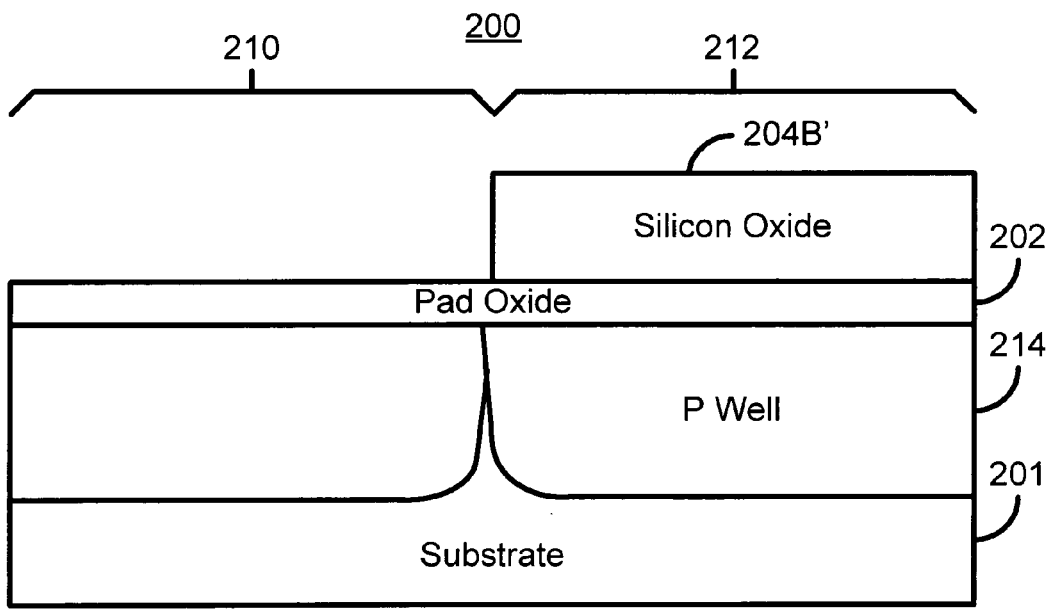
Figure 13:
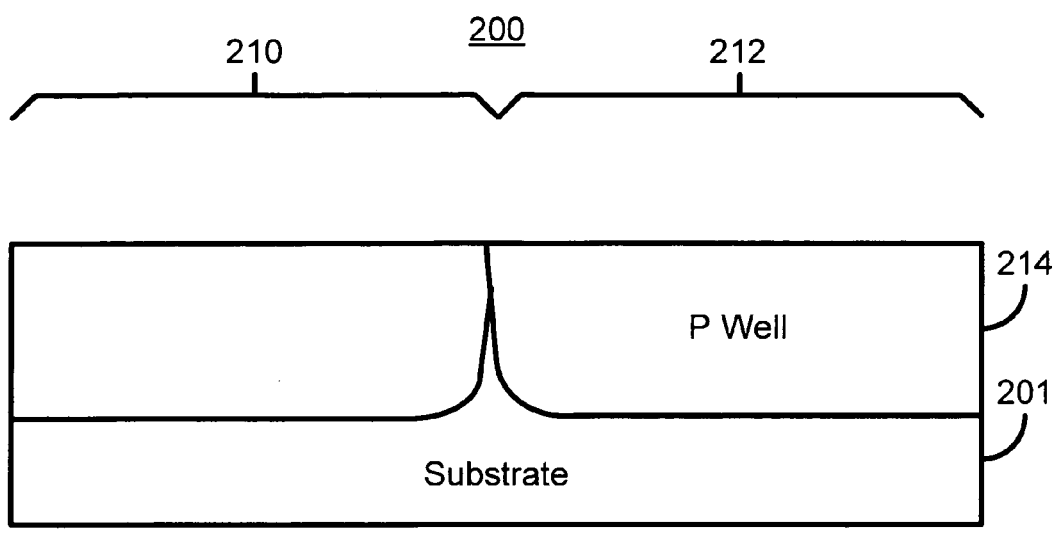

The N well is provided by implanting an N-type dopant, via step 172. Because of the presence of the oxide 204B', the N-type dopant does not penetrate the oxide 204B'. Thus, the P well 214 remains. FIG. 12 depicts the semiconductor device 200 after step 172 has been performed. Thus, the N well 216 has been provided. The semiconductor device 200 is cleaned by removing the pad oxide, preferably using a BOE, via step 174. FIG. 13 depicts the semiconductor device 200 after step 174 is performed. The surface 218 of the semiconductor device 200 is identified. As can be seen in FIG. 13, the surface 218 is substantially planar. Stated differently, the surfaces of the N well 216 and the P well 214 for the twin well are substantially coplanar, allowing the surface 218 to be substantially flat. Subsequent processing of the semiconductor device 200 can then be performed.

Using the method 100 and 150 a self-aligned twin well device is formed. Stated differently, the N and P wells are adjacent and self aligned. Consequently, there is no requirement for rigorous alignment of photoresist masks to provide the N and P twin wells. Furthermore, the surfaces of the N well and the P well are coplanar. Consequently, subsequent processing is greatly facilitated. This is achieved relatively simply, without requiring expensive additional masks and processing steps.

Figure 14:
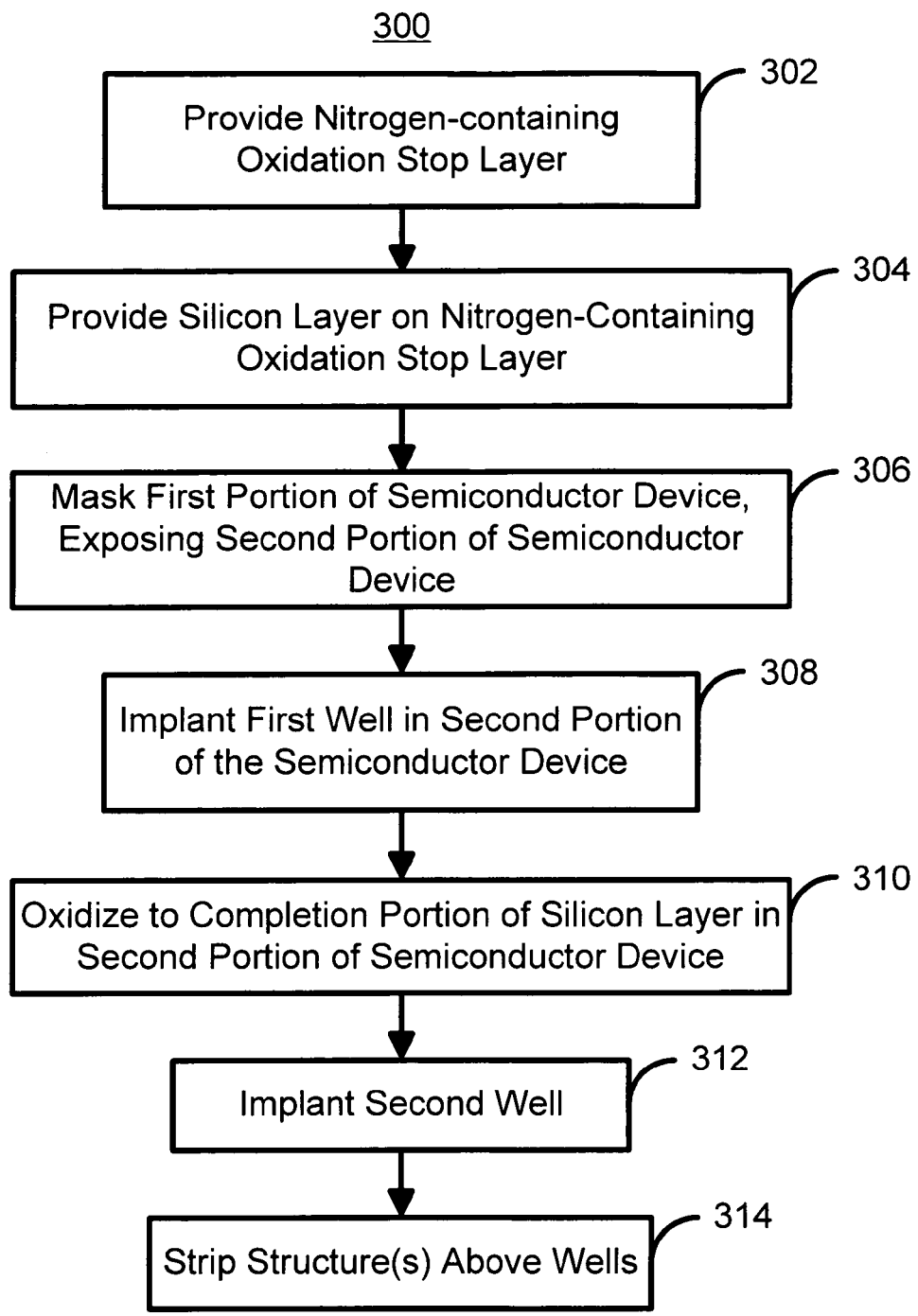
FIG. 14 is a flow chart of another embodiment of a method in accordance with the present invention for forming a twin well device having a uniform surface.

FIG. 14 is a flow chart of a one embodiment of a method 300 in accordance with the present invention for forming a twin well device having coplanar surfaces. The method 300 more fully describes the method 100 in an embodiment in which an oxidation stop layer is used. The method 300 is described in the context of forming a single twin well having an N-well and a P-well. However, one of ordinary skill in the art will readily recognize that the method 300 is generally extended to forming multiple twin wells on a silicon wafer. Furthermore, only certain steps are described in the method 300. Additional steps may also be included.

A nitrogen-containing oxidation stop layer is provided, preferably on a pad oxide layer, via step 302. In a preferred embodiment, the nitrogen-containing layer is silicon nitride, silicon oxide, a silicon nitride-silicon oxide stack (ONO), or silicon oxynitride. In a preferred embodiment, the nitrogen containing layer provided in step 302 is at least eighty Angstroms in thickness. However, the nitrogen-containing layer is configured to prevent oxidation of underlying layer(s) during oxidation of a subsequent layer. Consequently, the nitrogen-containing layer provided in step 302 has a thickness sufficient to perform this function. The pad oxide is preferably between fifty and three hundred Angstroms in thickness. A sacrificial layer is provided on the nitrogen-containing oxidation stop layer, via step 304. In a preferred embodiment, the sacrificial layer is a silicon layer. Consequently, the method 300 is described in the context of the sacrificial layer being a silicon layer.

A first portion of the semiconductor device is masked while a second portion of the semiconductor device is exposed, via step 306. In a preferred embodiment, the P-well is to be formed in the first portion of the device, while the N-well is formed in the second portion of the device. Step 306 may include utilizing a photoresist mask on the first portion of the device. In a preferred embodiment, the mask includes the photoresist and at least a silicon nitride layer and an additional pad oxide, as well as other layers. Also in a preferred embodiment, the silicon nitride layer is formed by providing multiple layers including the silicon nitride layer on both the first and second portions of the device, then removing the silicon nitride from the second portion of the device. The mask generally prevents implantation of a dopant into the first portion of the semiconductor device.

Using a first dopant, a first well is implanted in the second portion of the semiconductor device, via step 308. In a preferred embodiment, step 308 includes implanting the N-well. Also in a preferred embodiment, step 308 includes using the first dopant to implant a portion of the silicon layer prior to implanting the first well. Because of the first portion of the device is masked, the first well resides in the second portion of the device.

The portion of the silicon layer in the second portion of the semiconductor device is oxidized to completion, via step 310. Step 310 is preferably performed after the photoresist mask is removed, but prior to removal of the silicon nitride. The oxide formed on the second portion of the semiconductor device in step 310 prevents a dopant being implanted from reaching substantially all the second portion of the semiconductor device. The oxide formed in step 310 is preferably at least one thousand Angstroms thick and generally approximately two thousand, two hundred Angstroms thick. In addition, the thickness of the oxide formed in step 310 could be adjusted by etching portions of the oxide or the silicon layer from which the oxide is formed. Because of the presence of the nitride-containing oxidation stop layer, the portion of the silicon layer can be oxidized to completion without concern that underlying layers will be adversely affected or that the silicon layer is incompletely oxidized.

Using a second dopant, a second well is implanted in the first portion of the semiconductor device, via step 312. Step 312 is preferably performed after removal of the silicon nitride layer. This removal is also preferably performed after the oxidizing step performed in step 310. Thus, second well is implanted in step 312 without the second dopant being implanted in the first well. Thus, N and P-wells for the twin well semiconductor device are formed. Any remaining structures above the wells are stripped after the second well is implanted, via step 314. Step 314 preferably includes the use of an anisotropic buffered oxide etch (BOE) and nitride removal.

Using the method 300 a self-aligned twin well device is formed. Stated differently, the first and second wells are adjacent and self aligned. Consequently, there is no requirement for rigorous alignment of photoresist masks to provide the twin wells. Furthermore, the surfaces of the first and second wells are coplanar. Moreover, because of the use of nitrogen-containing oxidation stop layer, the silicon layer may be completely oxidized without concern that oxygen will diffuse through the underlying pad oxide and consume the underlying silicon. Thus, generation of nonuniformities or other defects in the surface of the wells may be reduced. Moreover, the oxide formed may be improved. Consequently, subsequent processing is facilitated and the semiconductor device improved.

Figure 15:
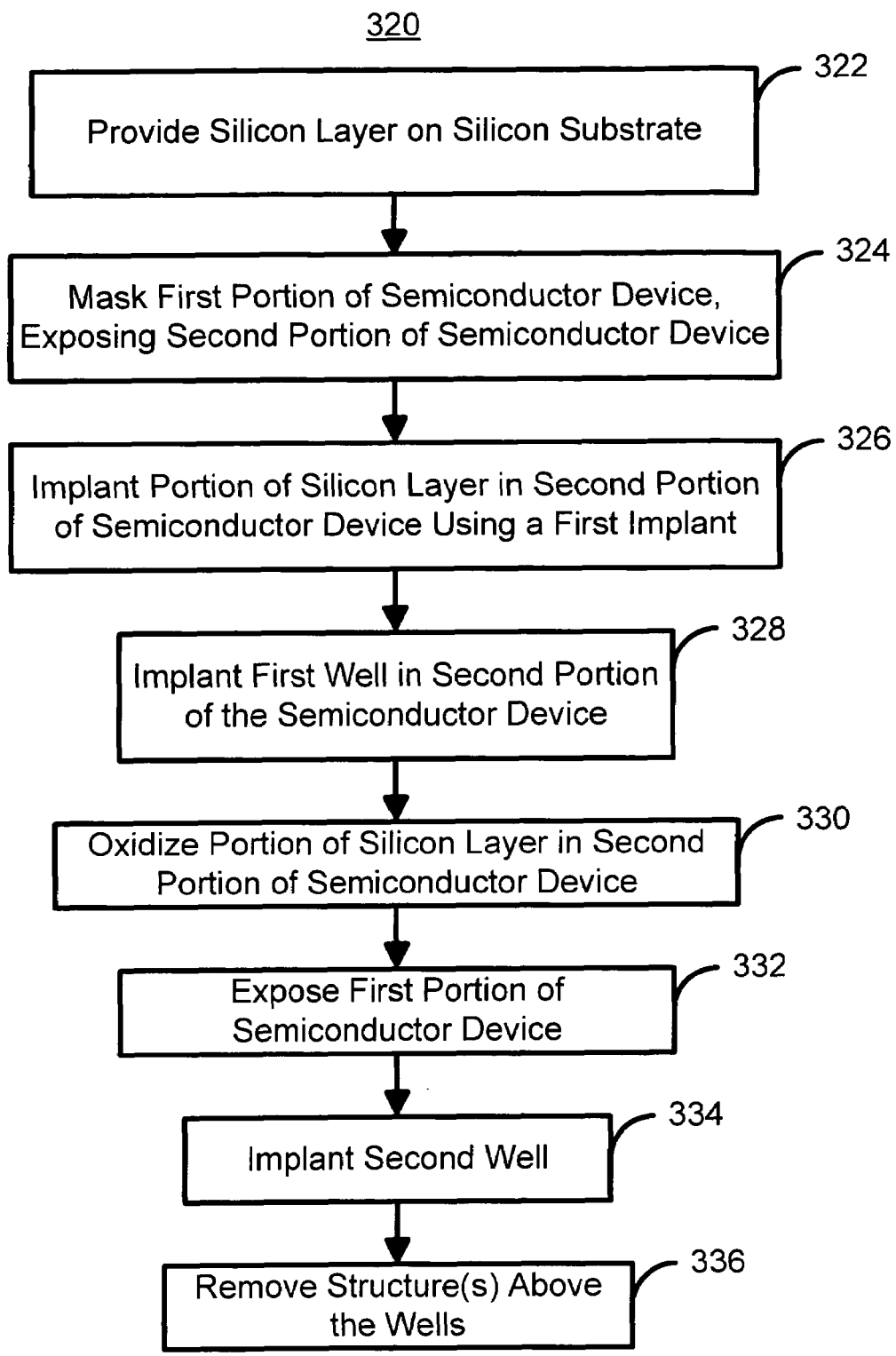
FIG. 15 is a flow chart of another embodiment of a method in accordance with the present invention for forming a twin well device having a uniform surface.

FIG. 15 is a flow chart of a one embodiment of a method 320 in accordance with the present invention for forming a twin well device having coplanar surfaces. The method 320 is described in the context of forming a single twin well having an N-well and a P-well. However, one of ordinary skill in the art will readily recognize that the method 320 is generally extended to forming multiple twin wells on a silicon wafer. Furthermore, only certain steps are described in the method 320. Additional steps may also be included.

A silicon layer is provided above the substrate, via step 322. In a preferred embodiment, the silicon layer is provided on the nitrogen-containing oxidation stop layer described above. A first portion of the semiconductor device is masked while a second portion of the semiconductor device is exposed, via step 324. In a preferred embodiment, the P-well is to be formed in the first portion of the device, while the N-well is formed in the second portion of the device. Step 324 may include utilizing a photoresist mask on the first portion of the device. In a preferred embodiment, the mask includes the photoresist and at least a silicon nitride layer formed on the silicon layer, as well as other layers. Also in a preferred embodiment, the silicon nitride layer is formed by providing multiple layers including the silicon nitride layer on both the first and second portions of the device, then removing the silicon nitride from the second portion of the device. The mask generally prevents implantation of a dopant into the first portion of the semiconductor device.

An implant is provided in a portion of the silicon layer using a first dopant, via step 326. The portion of the silicon layer that is implanted is in the second portion of the device. In a preferred embodiment, the implant is an N-type implant. Using the first dopant, a first well is implanted in the second portion of the semiconductor device, via step 328. Thus, the same dopant implanted into the silicon layer in step 326 is used in forming the first well. In a preferred embodiment, step 328 includes implanting the N-well. Because of the first portion of the device is masked, the first well resides in the second portion of the device. Step 328 may include another implantation of silicon or phosphorous. This additional implant of a low energy and a high dose causes the silicon layer to have a higher oxidation rate. The energy selected is low enough so that ions do not penetrate into the N-well, perhaps 20 keV with a dose of $5 \times 10^{15}$ ions/cm$^2$. The unimplanted silicon, above the first portion of the device, oxidizes more slowly. Consequently, lateral oxidation is reduced.

A portion of the silicon layer in the second portion of the semiconductor device is oxidized, preferably to completion, after the first well is implanted, via step 330. Because the silicon layer had been implanted in the second portion of the device, the oxidation in step 330 proceeds more rapidly. Thus, lateral oxidation under the nitride, or other, layer may be dramatically reduced. The oxide formed on the second portion of the semiconductor device in step 330 prevents a dopant being implanted from reaching substantially all the second portion of the semiconductor device. The first portion of the device is exposed after the silicon layer is oxidized, via step 332. Step 332 preferably includes removing the silicon nitride layer.

Using a second dopant, a second well is implanted in the first portion of the semiconductor device, via step 334. Step 334 is preferably performed after the first portion of the semiconductor device is exposed in step 332. Thus, second well is implanted in step 334 without the second dopant being implanted in the first well. Thus, N-wells and P-wells for the twin well semiconductor device are formed. Any remaining structures, such as masking or oxide layer, above the wells are removed, via step 336. Step 336 is preferably includes using anisotropic oxide etches and may include nitride strips.

Using the method 320 a self-aligned twin well device is formed. Stated differently, the first and second wells are adjacent and self aligned. Consequently, there is no requirement for rigorous alignment of photoresist masks to provide the twin wells. Furthermore, the surfaces of the first and second wells are coplanar. Consequently, subsequent processing is greatly facilitated. In addition, in an embodiment in which another implant of silicon or phosphorous is provided, as discussed above for step 328, the oxidation may be more rapid and lateral oxidation may be reduced.

Figure 16:
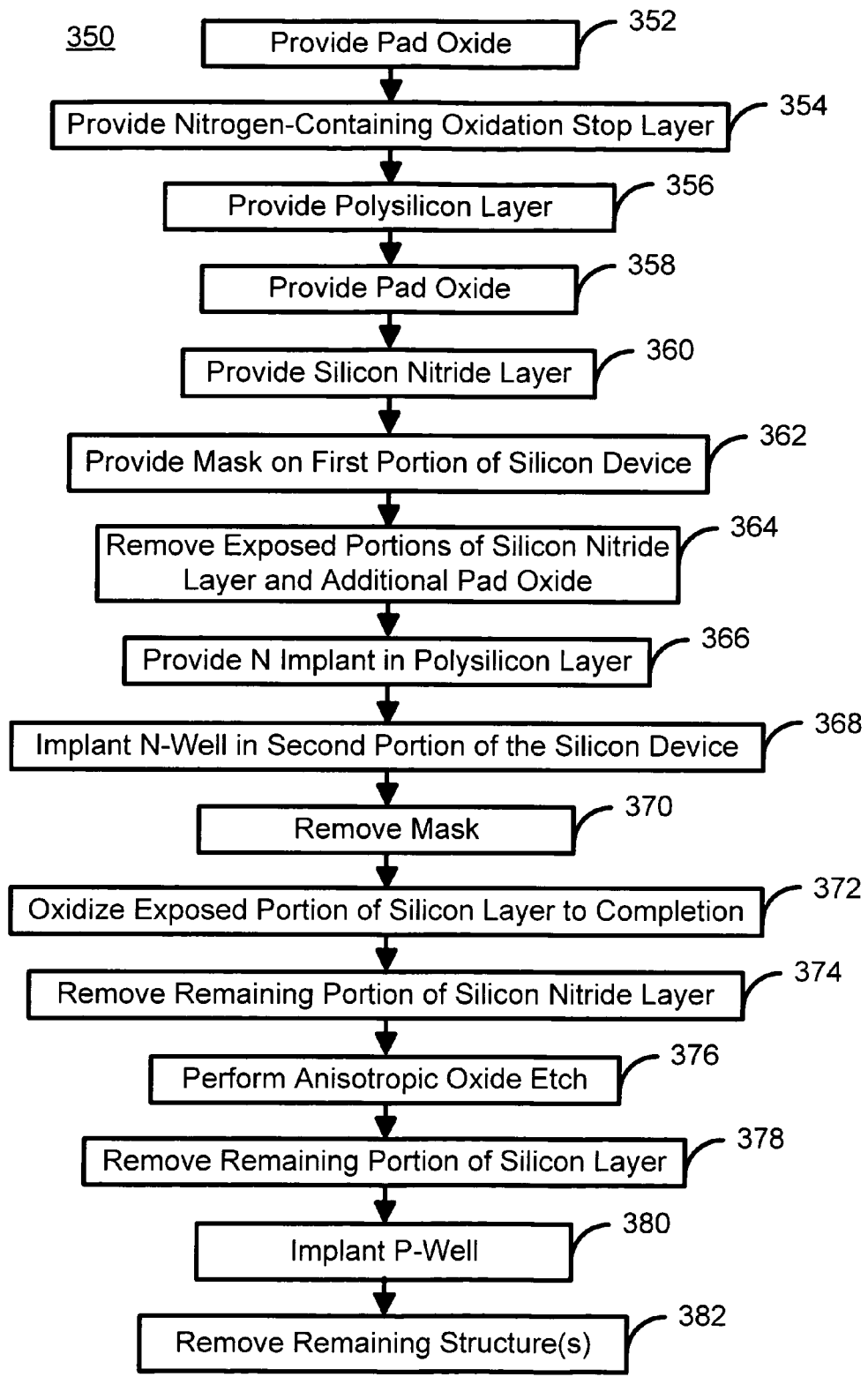
FIG. 16 is a flow chart of another embodiment of a method in accordance with the present invention for forming a twin well device having a uniform surface.

FIG. 16 is a flow chart of another, preferred, embodiment of a method 350 in accordance with the present invention for forming a twin well device having coplanar surfaces. FIGS. 17-27 depict one embodiment of twin well device 400 in accordance with the present invention during fabrication using the method 350. Thus, the method 350 is described in the context of the semiconductor device 400. For clarity, the semiconductor device 400 depicted in FIG. 17-27 is not drawn to scale.

Figure 17:
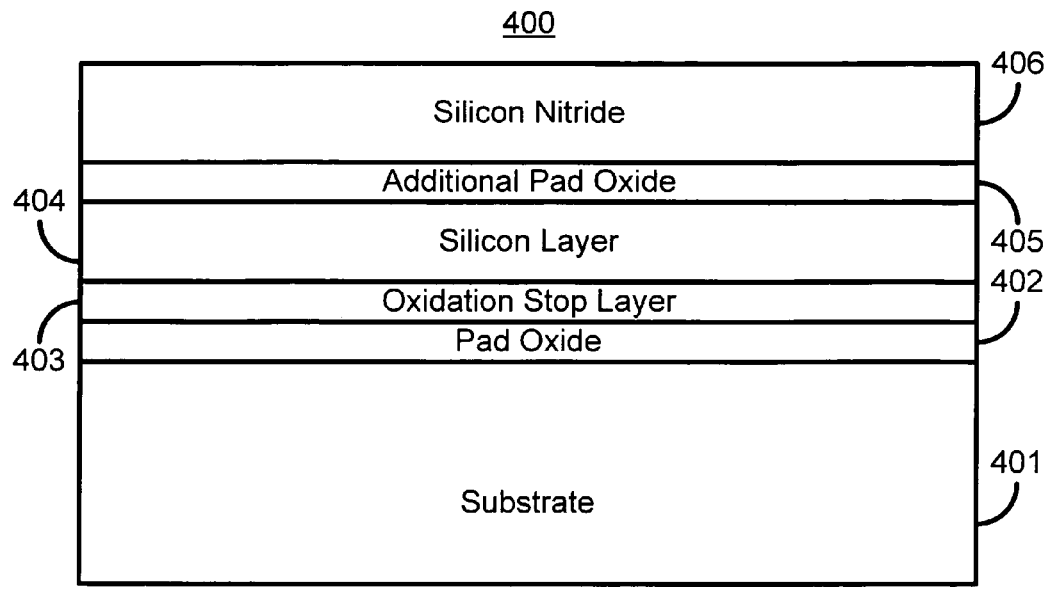
FIGS. 17-27 depict another embodiment of twin well device in accordance with the present invention during fabrication.

Referring to FIGS. 16 and 17-27, a pad oxide, a nitrogen-containing oxidation stop layer, a polysilicon layer, an additional pad oxide, and a silicon nitride layer are provided, via steps 352, 354, 356, 358, and 360 respectively. The pad oxide, nitrogen-containing oxidation stop layer are preferably as discussed above. FIG. 17 depicts the semiconductor device 400 after step 360 has been completed. The semiconductor device 400 thus includes a pad oxide 402 formed on substrate 401, the nitrogen-containing oxidation stop layer 403, a polysilicon layer 404, an additional pad oxide 405, and a silicon nitride layer 406. The polysilicon layer 404 is sufficiently thick that, when oxidized, the layer 404 can prevent dopant from reaching underlying layers. The additional pad oxide 405 is preferably between two and two hundred Angstroms thick. The silicon nitride layer 406 is thick enough to prevent oxidation of an underlying layer. Thus, the silicon nitride layer 406 is preferably approximately two thousand Angstroms thick.

Figure 18:
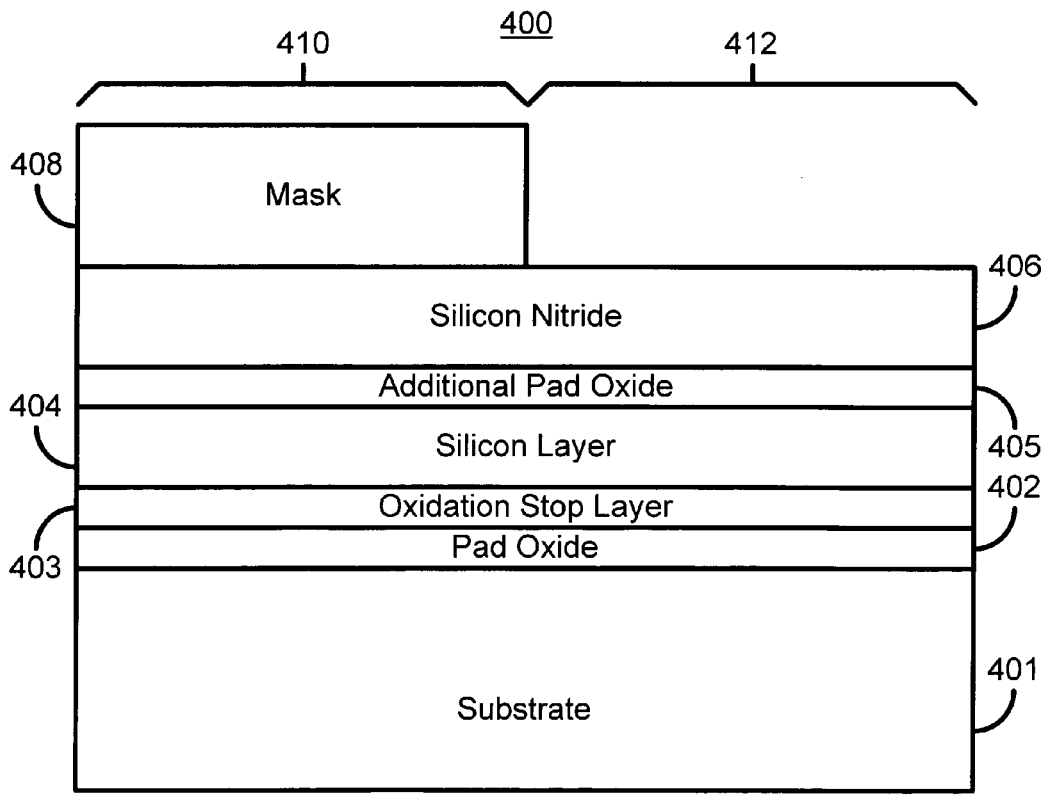
Figure 19:
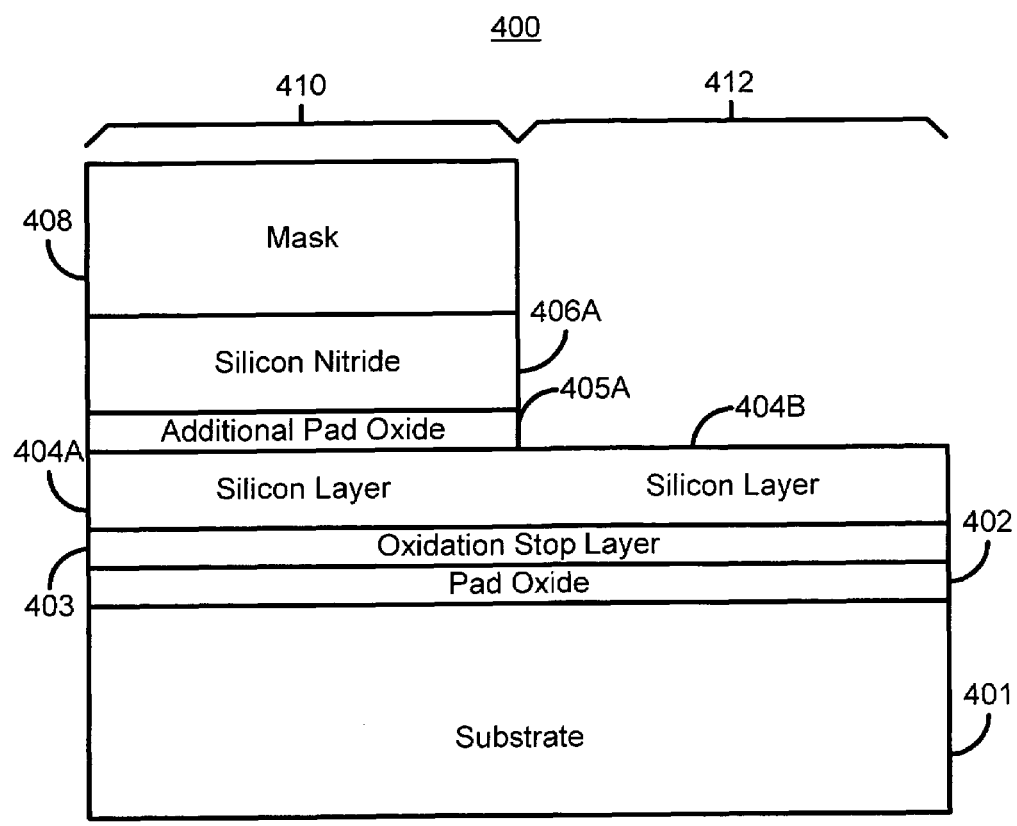

A photoresist mask is provided on a first portion of the semiconductor device 400, via step 362. Thus, the photoresist mask exposes a second portion of the semiconductor device 400. FIG. 18 depicts the semiconductor device 400 after the mask 408 has been provided. Thus, a first portion 410 of the semiconductor device 400 is covered while the second portion of the device 412 is exposed. A portion of the silicon nitride layer 406 that is in the second portion 402 of the semiconductor device 400 is removed, via step 364. FIG. 19 depicts the semiconductor device 400 after step 364 is completed. Thus, only silicon nitride 406A and additional pad oxide 405A under the mask 408 remains. The portion of the silicon layer 404A in the first portion 410 of the semiconductor device 400 is masked, while the portion of the silicon layer 404B in the second portion 412 of the semiconductor device 400 is exposed.

An implant is provided in a portion of the silicon layer using an N-type dopant, via step 366. The portion of the silicon layer that is implanted is in the second portion of the device. Using the N-type dopant, a first well is implanted in the second portion of the semiconductor device, via step 368. Thus, the same dopant implanted into the silicon layer in step 366 is used in forming the N-well. Because of the first portion of the device is masked, the N-well resides in the second portion of the device.

Figure 20:
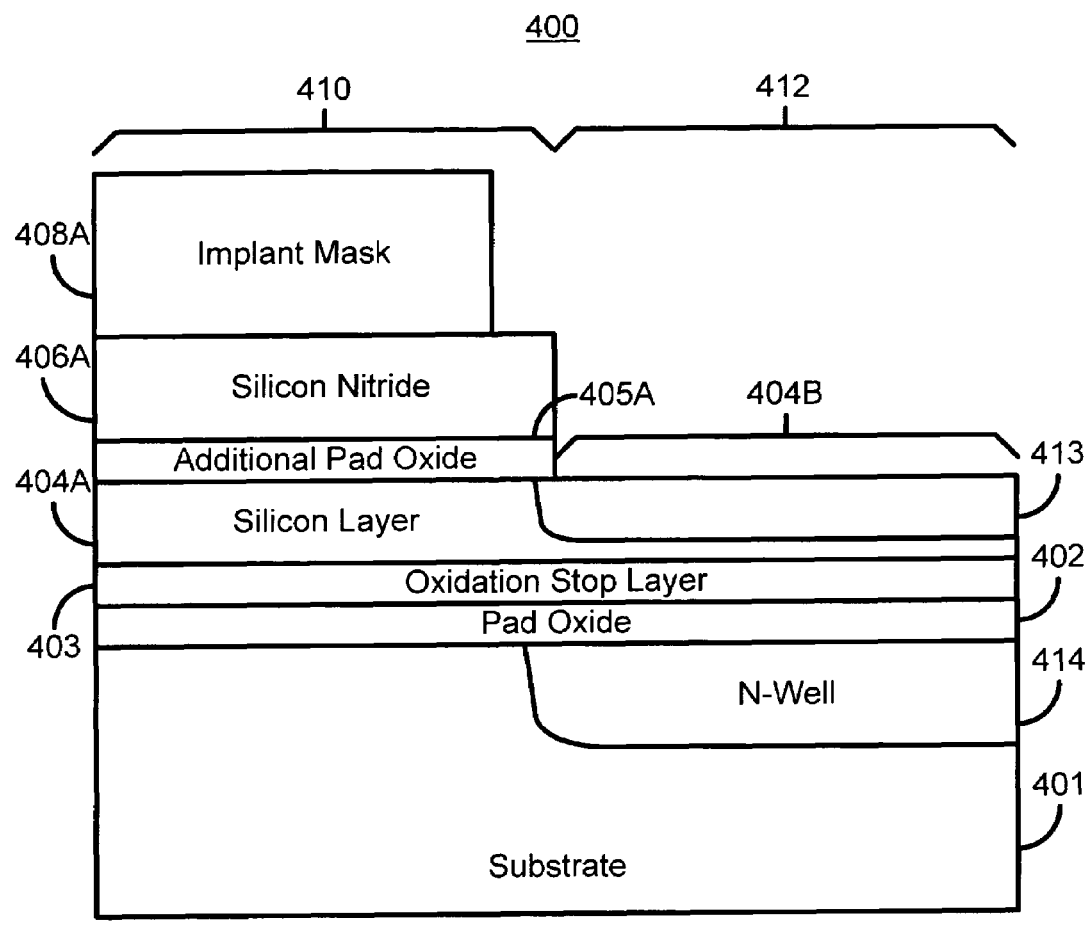

FIG. 20 depicts the semiconductor device 400 after step 368 is completed. Because the first portion 410 of the semiconductor device 400 is masked, the implant only penetrates the substrate 401 in the second portion 412 of the device. Thus, the N-well 414 resides in the second portion 412 of the semiconductor device 400.

Figure 21:
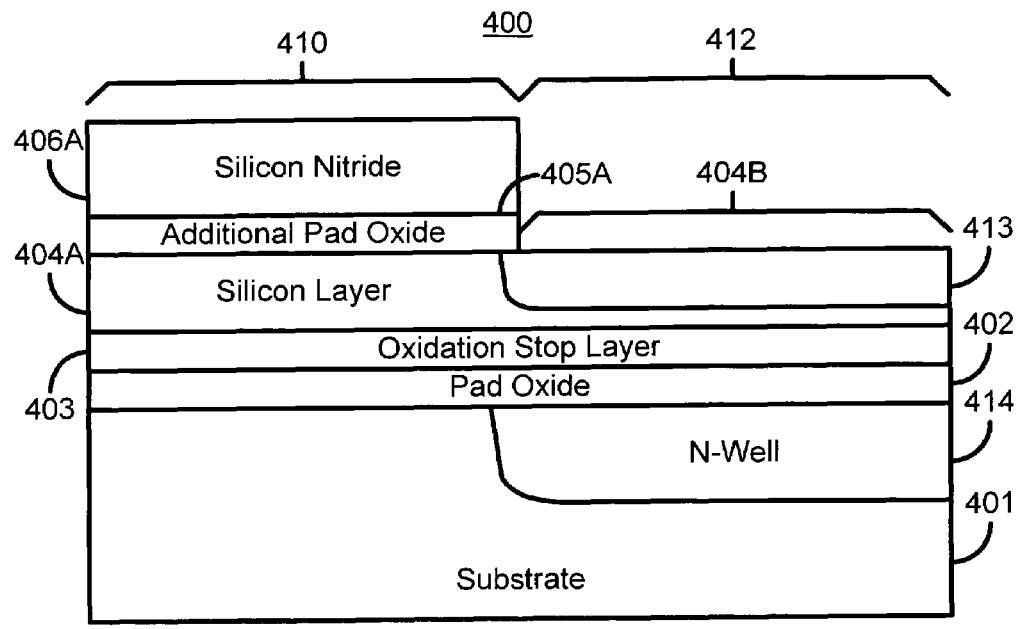
Figure 22:
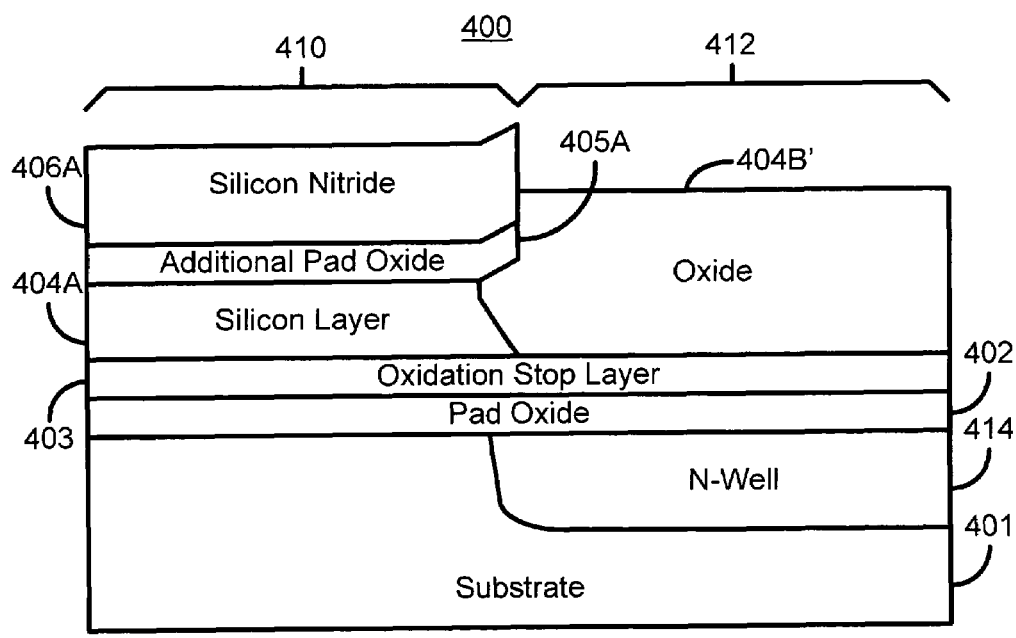

The photoresist mask 408 is removed, via step 370. FIG. 21 depicts the semiconductor device 400 after the mask 408 is removed in step 370. Thus, the silicon nitride 406A is exposed. The exposed silicon layer 404B is oxidized to completion, via step 372. FIG. 22 depicts the semiconductor device 400 after step 372 is completed. Thus, the mask 408 is no longer present. In addition, the silicon oxide 404B' has been formed in the second portion 412 of the device. In a preferred embodiment, the thickness of the silicon oxide 404B' is at least one thousand hundred Angstroms thick and preferably about two thousand, two hundred Angstroms thick. However, at minimum the silicon oxide 404B' has a thickness sufficient to prevent ions implanted into the first portion of the semiconductor device 400 from reaching the N-well 414. In addition, the thickness of the silicon oxide 404B' could be adjusted by etching portions of the oxide or the silicon layer from which the oxide is formed.

Figure 23:
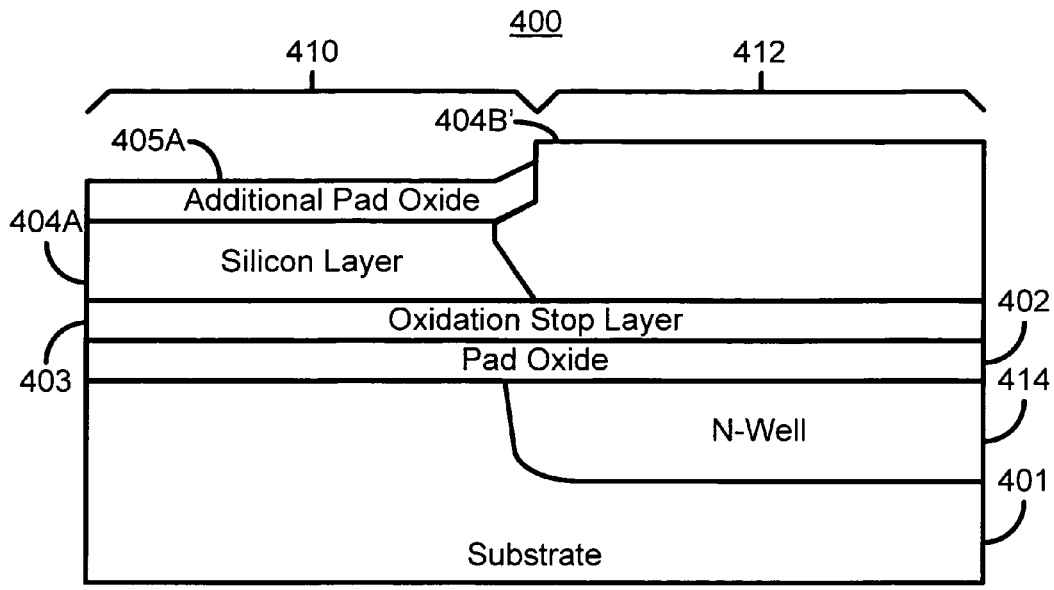
Figure 24:
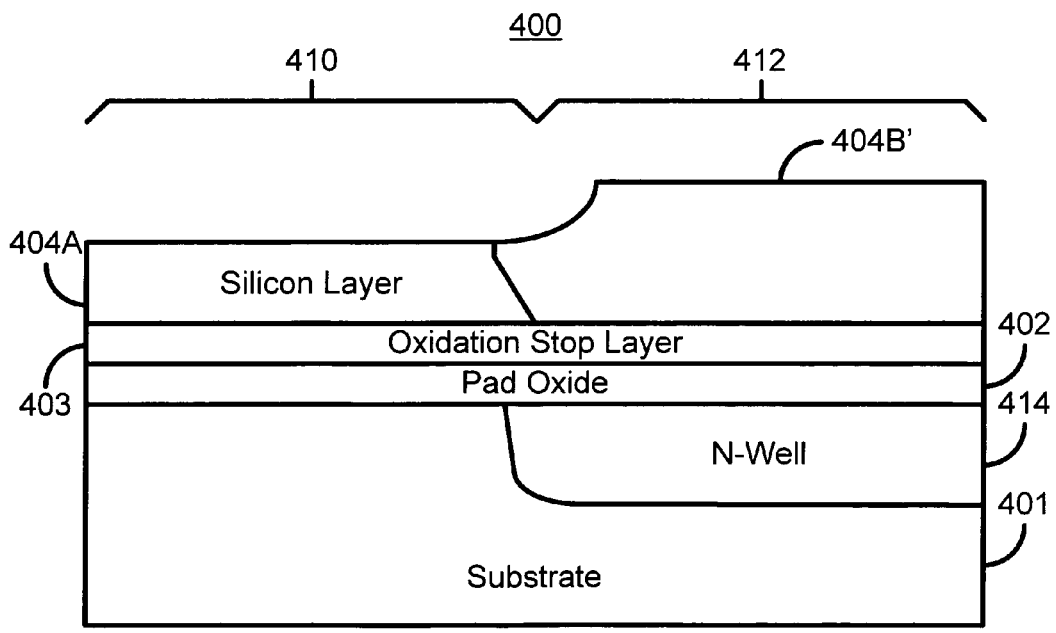
Figure 25:
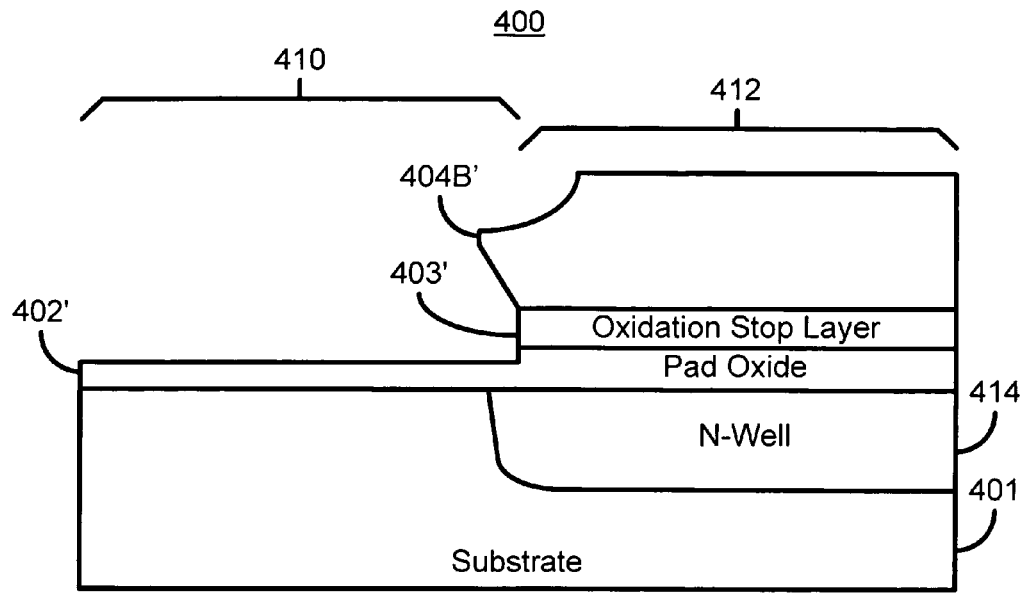

The remaining portion of the silicon nitride 406A is removed, via step 374. FIG. 23 depicts the semiconductor device 400 after the silicon nitride 406A has been removed. An anisotropic oxide etch is performed, via step 376. FIG. 24 depicts the semiconductor device 400 after step 376 is completed. Thus, the profile of the oxide 404B' has changed and the additional pad oxide 405A removed. The remaining portion of the silicon layer 404A is removed, via step 378. Step 378 is preferably performed using a dry etch. FIG. 25 depicts the semiconductor device 400 after the portion of the silicon layer 404A has been removed.

Figure 26:
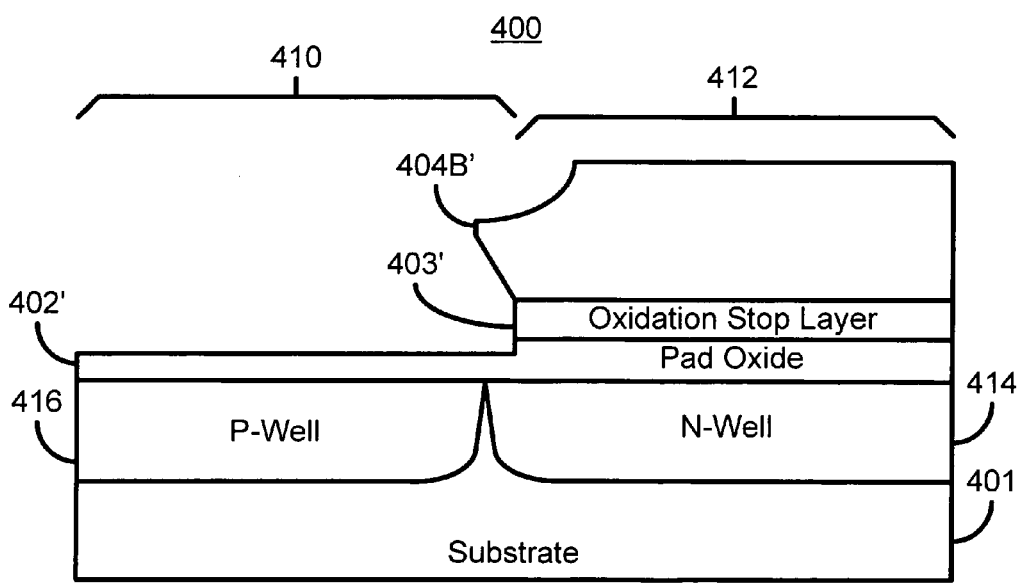
Figure 27:
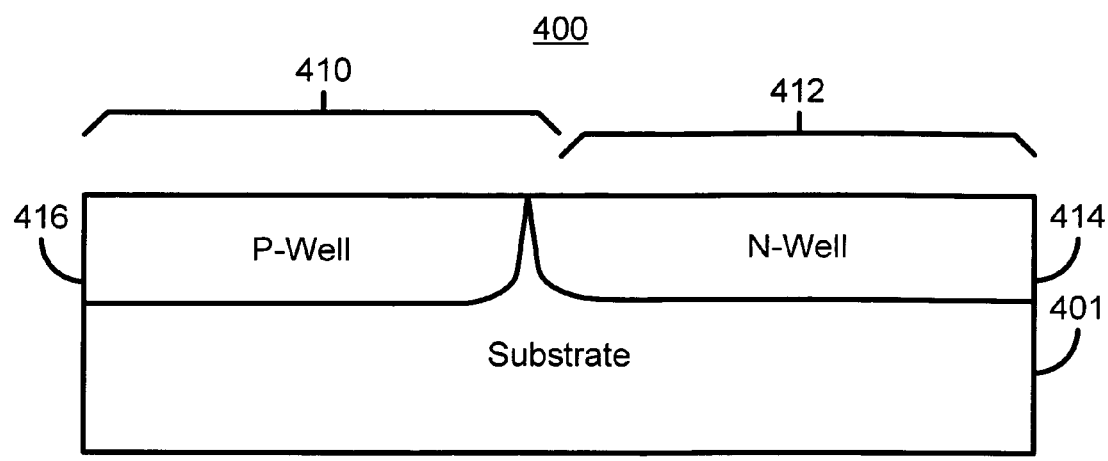

The P-well is provided by implanting a P-type dopant, via step 380. Because of the presence of the oxide 404B', the P-type dopant does not penetrate the oxide 404B'. Thus, the N-well 414 remains. FIG. 26 depicts the semiconductor device 400 after step 380 has been performed. Thus, the P-well 416 has been provided. The structures remaining above the wells are removed, via step 382. Step 382 preferably includes an anisotropic oxide etch to remove the silicon oxide 404B', a nitride strip to remove the nitrogen-containing oxidation stop layer 403', and another anisotropic oxide etch strip to remove the pad oxide 402'. FIG. 27 depicts the semiconductor device 400 after step 382 is performed. The surface 418 of the semiconductor device 400 is identified. As can be seen in FIG. 27, the surface 418 is substantially planar. The surface 418 is substantially free of defects, steps or other nonuniformities. Moreover, the surfaces of the N-well 416 and the P-well 414 for the twin well are substantially coplanar, allowing the surface 418 to be substantially flat. Subsequent processing of the semiconductor device 400 can then be performed.

Using the method 350 a self-aligned twin well device is formed. Stated differently, the N-wells and P-wells are adjacent and self aligned. Because of the use of nitrogen-containing oxidation stop layer, the silicon layer may be completely oxidized without concern that oxygen will diffuse through the underlying pad oxide and consume the underlying silicon. Thus, generation of nonuniformities or other defects in the surface of the wells may be reduced. Moreover, the oxide formed may be improved. In addition, because of the silicon is implanted, the oxidation is more rapid and lateral oxidation reduced. Consequently, subsequent processing is facilitated and the semiconductor device improved.

A method and system for providing a twin-well semiconductor device has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for providing a twin well in a semiconductor device, the twin well including a P-well and an N-well comprising:

providing a nitrogen-containing oxidation stop layer on a first pad oxide;

providing a silicon layer on the nitrogen-containing oxidation stop layer;

providing a second pad oxide on the silicon layer;

masking a first portion of the semiconductor device, a second portion of the semiconductor device being exposed;

implanting a first well in the second portion of the semiconductor device using a first dopant;

oxidizing to completion a portion of the silicon layer in the second portion of the semiconductor device after the first well implanting;

implanting a second well in the first portion of the semiconductor device after the oxidizing using a second dopant; and removing any remaining structure above the first and second wells of the semiconductor device after the second well implanting.

2. The method of claim 1 wherein the masking further including:
- providing a silicon nitride layer on a first portion of the silicon layer in the first portion of the semiconductor device; and
- providing an implant mask on the silicon nitride layer.

3. The method of claim 2 wherein the silicon nitride layer providing further includes:
- providing a blanket layer of silicon nitride on the first portion and the second portion of the semiconductor device;
- providing a mask on the first portion of the semiconductor device; and
- removing a portion of the blanket layer of the silicon nitride on the second portion of the device such that the silicon nitride layer remains.

4. The method of claim 2 further comprising:
- removing the silicon nitride layer after the oxidizing.

5. The method of claim 4 further comprising:
- performing an anisotropic oxide vertical etch prior to the second well implanting.

6. The method of claim 4 further comprising:
- removing a remaining portion of the silicon layer on the first portion of the semiconductor device after the silicon nitride layer is removed.

7. The method of claim 1 further comprising:
- providing an implant of the portion of the silicon layer using the first dopant prior to the first well implanting.

8. The method of claim 1 wherein the first well is the N-well and the second well is the P-well.

9. A method for providing a twin well in a semiconductor device, the twin well including a P-well and an N-well comprising:
- providing a nitrogen-containing oxidation stop layer on a first pad oxide;
- providing a silicon layer on the oxidation stop layer;
- providing a second pad oxide on the silicon layer;
- masking a first portion of the semiconductor device, a second portion of the semiconductor device being exposed;
- providing an implant of the portion of the silicon layer using a first dopant.
- implanting a first well in the second portion of the semiconductor device using the first dopant after the implant is provided in the portion of the silicon layer;
- oxidizing a portion of the silicon layer in the second portion of the semiconductor device after the first well implanting;
- exposing the first portion of the semiconductor device;
- implanting a second well in the first portion of the semiconductor device using a second dopant after the oxidizing; and
- removing any remaining structure above the first and second wells of the semiconductor device after the second well implanting.

10. A method for providing a twin well in a semiconductor device, the twin well including a P-well and an N-well, comprising:
- providing a first pad oxide;
- providing a nitrogen-containing oxidation stop layer on the first pad oxide;
- providing a polysilicon layer on the nitrogen-containing oxidation stop layer;
- providing a second pad oxide on the polysilicon layer;
- providing a silicon nitride layer on the second pad oxide;
- providing a photoresist mask on a first portion of the semiconductor device, a second portion of the semiconductor device being exposed;
- removing a portion of the silicon nitride layer and a portion of the second pad oxide on the second portion of the semiconductor device;
- implanting an N-type dopant in a portion of the polysilicon layer in the second portion of the semiconductor device;
- providing the N-well in the second portion of the semiconductor device;
- removing the photoresist mask;
- oxidizing a portion of the silicon layer on the second portion of the semiconductor device to completion;
- removing a remaining portion of the silicon nitride layer on the first portion of the semiconductor device;
- performing a blanket etch;
- removing a remaining portion of the silicon layer on the first portion of the semiconductor device;
- providing the P-well in the first portion of the semiconductor device; and
- removing any remaining structure above the first and second wells of the semiconductor device after the second well implanting.

* * * * *

UNITED STATES PATENT AND TRADEMARK OFFICE
CERTIFICATE OF CORRECTION

PATENT NO.       : 7,642,181 B2
APPLICATION NO.  : 11/343179
DATED            : January 5, 2010
INVENTOR(S)      : Miller, Jr. et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 618 days.

Signed and Sealed this

Twenty-first Day of December, 2010

David J. Kappos
*Director of the United States Patent and Trademark Office*